(12) United States Patent
Jung (10) Patent No.: US 10,311,924 B2
(45) Date of Patent: Jun. 4, 2019

(54) RECEIVER CIRCUIT, AND SEMICONDUCTOR DEVICE AND SYSTEM INCLUDING THE SAME

(71) Applicant: SK hynix Inc., Icheon-si, Gyeonggi-do (KR)

(72) Inventor: Hae Kang Jung, Gwangmyeong-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/462,286

(22) Filed: Mar. 17, 2017

(65) Prior Publication Data

US 2018/0137901 A1 May 17, 2018

(30) Foreign Application Priority Data

Nov. 14, 2016 (KR) .................. 10-2016-0150871

(51) Int. Cl.
  *G11C 7/22* (2006.01)
  *G11C 8/18* (2006.01)
  *G11C 7/10* (2006.01)

(52) U.S. Cl.
  CPC ........... *G11C 7/222* (2013.01); *G11C 7/1066* (2013.01); *G11C 7/1093* (2013.01); *G11C 8/18* (2013.01); *G11C 2207/2254* (2013.01)

(58) Field of Classification Search
  CPC .................. G11C 7/22; G11C 7/222
  See application file for complete search history.

(56) References Cited

U.S. PATENT DOCUMENTS

| | | | |
|---|---|---|---|
| 6,339,353 B1* | 1/2002 | Tomita | G11C 7/109 327/112 |
| 2008/0048747 A1* | 2/2008 | Iizuka | G11C 7/1066 327/261 |
| 2016/0133309 A1* | 5/2016 | Maryan | G11C 7/1087 713/401 |

FOREIGN PATENT DOCUMENTS

KR   1020120045485 A   5/2012

\* cited by examiner

*Primary Examiner* — Huan Hoang
*Assistant Examiner* — Jay W. Radke
(74) *Attorney, Agent, or Firm* — William Park & Associates Ltd.

(57) ABSTRACT

A receiver circuit may be provided. The receiver circuit may include a delay circuit and a synchronization circuit. The delay circuit may variably delay a data strobe signal based on a delay select signal. The synchronization circuit may generate internal data from data in synchronization with the variably delayed data strobe signal.

16 Claims, 5 Drawing Sheets

<ISI not occurred>

<ISI occurred>

RECEIVER CIRCUIT, AND SEMICONDUCTOR DEVICE AND SYSTEM INCLUDING THE SAME

CROSS-REFERENCES TO RELATED APPLICATION

The present application claims priority under 35 U.S.C. § 119(a) to Korean application number 10-2016-0150871, filed on Nov. 14, 2016, in the Korean Intellectual Property Office, which is incorporated herein by reference in its entirety.

BACKGROUND

1. Technical Field

Various embodiments may generally relate to a semiconductor technology, and, more particularly, to a receiver circuit, and a semiconductor device and system including the same.

2. Related Art

Electronic apparatuses consist of a large number of electronic components. Among the electronic apparatuses, a computer system consists of many electronic components which are constructed by semiconductor devices. The semiconductor devices which construct the computer system may transmit or receive data in synchronization with a clock. In particular, a master device such as a processor and a slave device such as a memory use a data strobe signal to transmit or receive data. For example, the master device transmits data and a data strobe signal to the slave device, and the slave device receives the data in synchronization with the data strobe signal. Also, the slave device transmits data and a data strobe signal to the master device, and the master device receives the data in synchronization with the data strobe signal.

In general, the semiconductor devices generate internal data by sampling the data in synchronization with the rising edge of the data strobe signal. However, while the data strobe signal is a signal which toggles like a clock signal, the data is a pseudo-random binary sequence (PRBS) signal. Therefore, the synchronization times of the data and the data strobe signal may not correspond to each other depending on the pattern and the rate of the data, and consequently, a setup margin for generating the internal data may decrease.

SUMMARY

In an embodiment, a receiver circuit may be provided. The receiver circuit may include a delay circuit and a synchronization circuit. The delay circuit may variably delay a data strobe signal based on a delay select signal. The synchronization circuit may generate internal data from data in synchronization with the variably delayed data strobe signal.

DETAILED DESCRIPTION

Hereinafter, a receiver circuit, and a semiconductor device and system including the same will be described below with reference to the accompanying drawings through various examples of embodiments.

Figure 1:
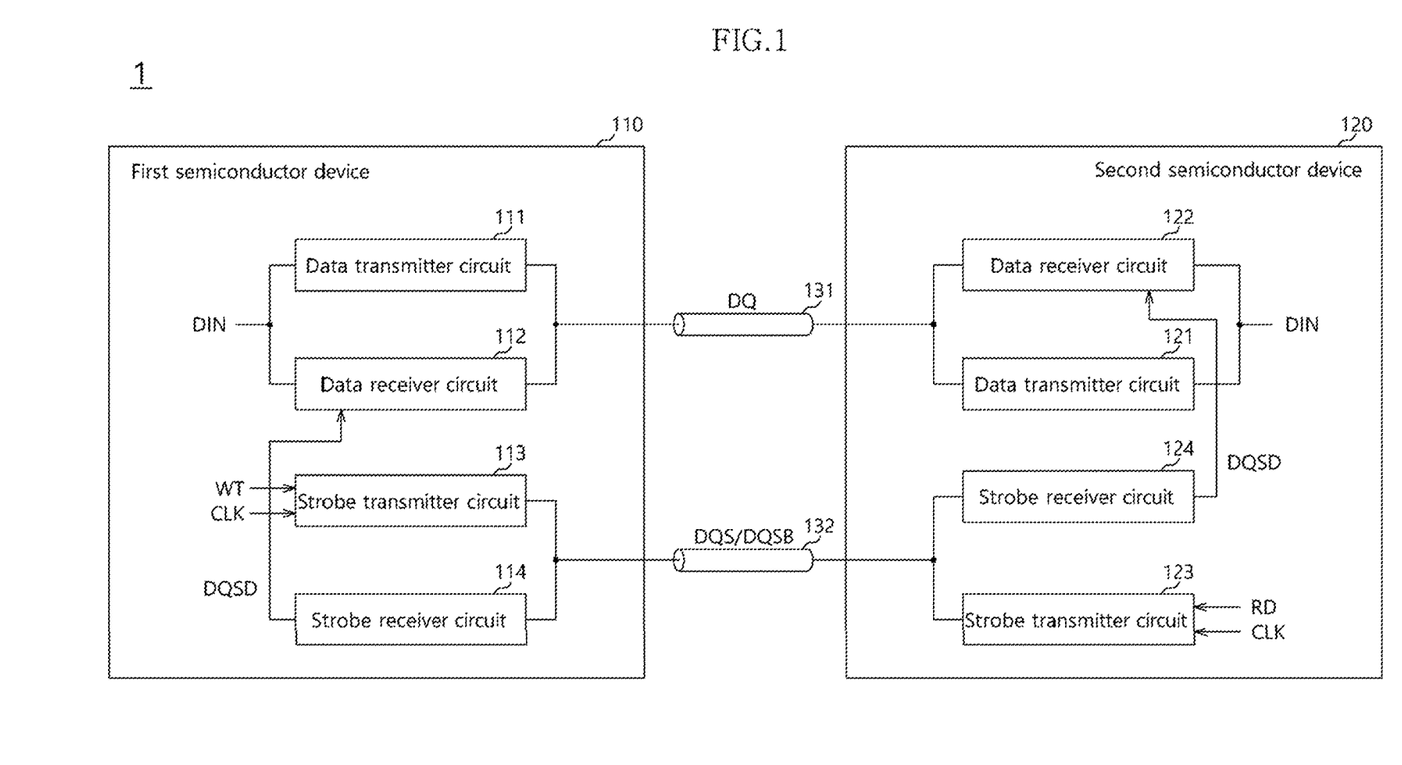
FIG. 1 is a diagram illustrating a representation of an example of the configuration of a system in accordance with an embodiment.

FIG. 1 is a diagram illustrating a representation of an example of the configuration of a system 1 in accordance with an embodiment. Referring to FIG. 1, the system 1 in accordance with an embodiment may include a first semiconductor device 110 and a second semiconductor device 120. The first semiconductor device 110 and the second semiconductor device 120 may be electronic components which communicate with each other. In an embodiment, the first semiconductor device 110 may be a master device, and the second semiconductor device 120 may be a slave device which operates by being controlled by the first semiconductor device 110. For example, the first semiconductor device 110 may be a host such as a processor, and the processor may include a central processing unit (CPU), a graphic processing unit (GPU), a multimedia processor (MMP) or a digital signal processor (DSP). The first semiconductor device 110 may be realized in the form of a system-on-chip (SOC) by combining processor chips having various functions, such as application processors (APs). The second semiconductor device 120 may be a memory, and the memory may include a volatile memory or a nonvolatile memory. The volatile memory may include, for example but not limited to, an SRAM (static RAM), a DRAM (dynamic RAM) or an SDRAM (synchronous DRAM), and the nonvolatile memory may include a ROM (read only memory), a PROM (programmable ROM), an EEPROM (electrically erasable and programmable ROM), an EPROM (electrically programmable ROM), a flash memory, a PRAM (phase change RAM), an MRAM (magnetic RAM), an RRAM (resistive RAM) or an FRAM (ferroelectric RAM).

The first and second semiconductor devices 110 and 120 may be coupled with each other through a plurality of signal transmission lines 131 and 132. The signal transmission lines 131 and 132 may be channels, links or buses. A first signal transmission line 131 may be a data channel which transmits data DQ. A second signal transmission line 132 may be a strobe channel or a clock channel which transmits a clock signal such as a data strobe signal DQS. Each of the first and second semiconductor devices 110 and 120 may include transmitter circuits and receiver circuits. The first semiconductor device 110 may include a data transmitter circuit 111, a data receiver circuit 112, a strobe transmitter circuit 113, and a strobe receiver circuit 114. The data transmitter circuit 111 and the strobe transmitter circuit 113 as transmitter circuits of the first semiconductor device 110 may generate output signals according to internal signals of the first semiconductor device 110, and transmit the output signals to the second semiconductor device 120 through the signal transmission lines 131 and 132, respectively. The data transmitter circuit 111 may generate data DQ according to internal data DIN of the first semiconductor device 110, and transmit the data DQ to the second semiconductor device 120 through the first signal transmission line 131. The strobe transmitter circuit 113 may generate a data strobe signal DQS or a clock signal which is synchronized with a time at which the data DQ is outputted, and transmit the data strobe signal DQS to the second semiconductor device 120 through the second signal transmission line 132.

The data receiver circuit 112 and the strobe receiver circuit 114 as receiver circuits of the first semiconductor device 110 may receive signals transmitted from the second semiconductor device 120 through the signal transmission lines 131 and 132, respectively, and generate internal signals. The data receiver circuit 112 may receive data DQ transmitted through the first signal transmission line 131, and generate internal data DIN. The strobe receiver circuit 114 may receive a data strobe signal DQS transmitted through the second signal transmission line 132, and generate a delayed data strobe signal DQSD or clock signal which is needed in generating the internal data DIN.

The second semiconductor device 120 may include a data transmitter circuit 121, a data receiver circuit 122, a strobe transmitter circuit 123, and a strobe receiver circuit 124. The data transmitter circuit 121 and strobe transmitter circuit 123 as transmitter circuits of the second semiconductor device 120 may generate output signals according to internal signals of the second semiconductor device 120, and transmit the output signals to the first semiconductor device 110 through the signal transmission lines 131 and 132, respectively. The data transmitter circuit 121 may generate the data DQ according to internal data DIN of the second semiconductor device 120, and transmit the data DQ to the first semiconductor device 110 through the first signal transmission line 131. The strobe transmitter circuit 123 may generate the data strobe signal DQS which is synchronized with a time at which the data DQ is outputted, and transmit the data strobe signal DQS to the first semiconductor device 110 through the second signal transmission line 132.

The data receiver circuit 122 and the strobe receiver circuit 124 as receiver circuits of the second semiconductor device 120 may receive signals transmitted from the first semiconductor device 110 through the signal transmission lines 131 and 132, respectively, and generate internal signals. The data receiver circuit 122 may receive the data DQ transmitted through the first signal transmission line 131, and generate internal data DIN. The strobe receiver circuit 124 may receive the data strobe signal DQS transmitted through the second signal transmission line 132, and generate a delayed data strobe signal DQSD which is needed in generating the internal data DIN.

The strobe transmitter circuit 113 may generate the data strobe signal DQS based on an operation information and a clock signal CLK. When an operation for the first semiconductor device 110 to transmit data DQ to the second semiconductor device 120 is defined as a write operation, the operation information may be an information associated with the write operation. The strobe transmitter circuit 113 may generate the data strobe signal DQS based on a write signal WT and the clock signal CLK. The strobe transmitter circuit 123 may generate the data strobe signal DQS based on an operation information and a clock signal CLK. When an operation for the second semiconductor device 120 to transmit data DQ to the first semiconductor device 110 is defined as a read operation, the operation information may be an information associated with the read operation. The strobe transmitter circuit 123 may generate the data strobe signal DQS based on a read signal RD and the clock signal CLK.

The strobe receiver circuit 114 may delay the data strobe signal DQS received through the second signal transmission line 132, and generate the delayed data strobe signal DQSD. The strobe receiver circuit 114 may include a delay circuit which delays the data strobe signal DQS and generates the delayed data strobe signal DQSD. The strobe receiver circuit 114 may provide the delayed data strobe signal DQSD to the data receiver circuit 112. The strobe receiver circuit 124 may delay the data strobe signal DQS received through the second signal transmission line 132, and generate the delayed data strobe signal DQSD. The strobe receiver circuit 124 may include a delay circuit which delays the data strobe signal DQS and generates the delayed data strobe signal DQSD. The strobe receiver circuit 124 may provide the delayed data strobe signal DQSD to the data receiver circuit 122.

Figure 2:
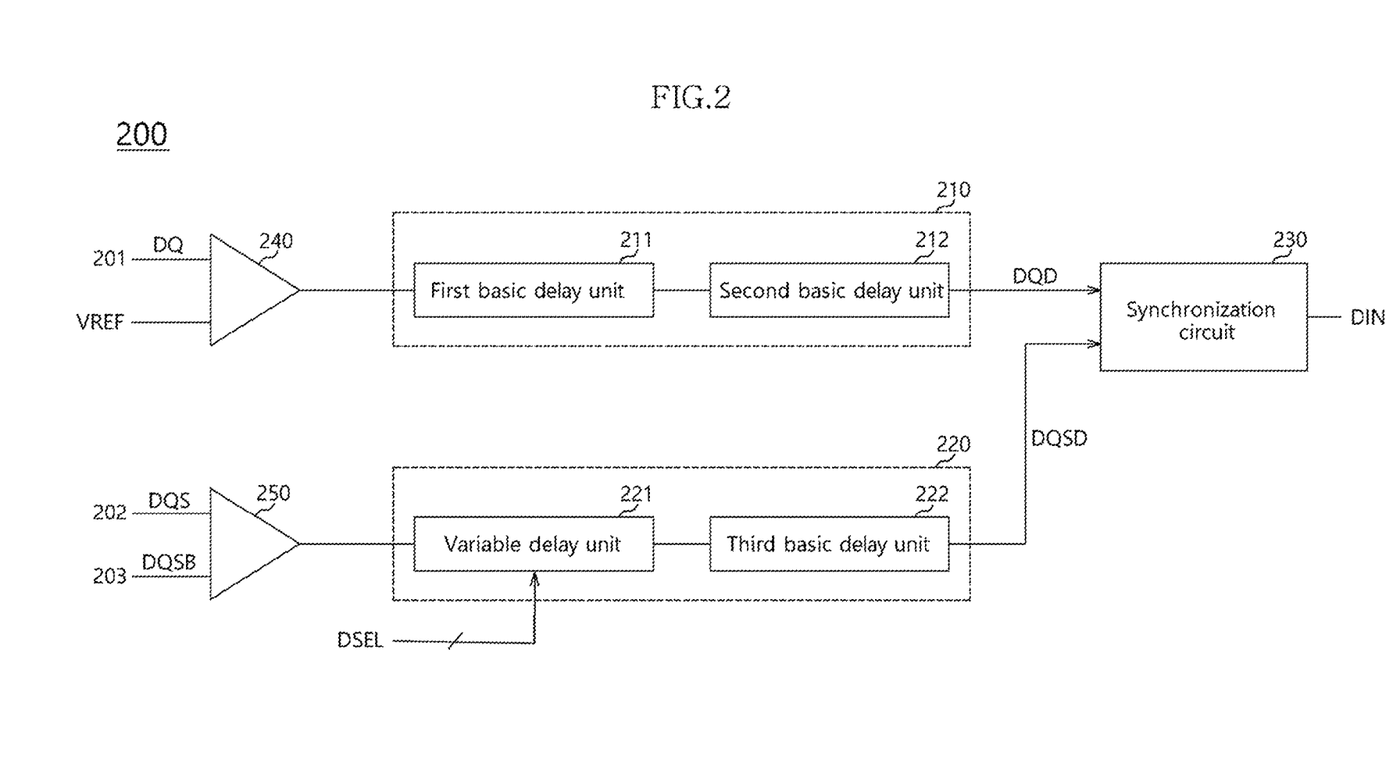
FIG. 2 is a diagram illustrating a representation of an example of the configuration of a receiver circuit in accordance with an embodiment.

FIG. 2 is a diagram illustrating a representation of an example of the configuration of a receiver circuit 200 in accordance with an embodiment. The receiver circuit 200 illustrated in FIG. 2 may be applied as the data receiver circuits 112 and 122 and the strobe receiver circuits 114 and 124 illustrated in FIG. 1. Referring to FIG. 2, the receiver circuit 200 may be coupled with a data channel 201 and a strobe channel 202, and receive data DQ and a data strobe signal DQS. The data channel 201 and the strobe channel 202 may be signal transmission lines which are coupled with an external device. The receiver circuit 200 may generate internal data DIN by sampling the data DQ with the data strobe signal DQS.

The receiver circuit 200 may include a first delay circuit 210, a second delay circuit 220, and a synchronization circuit 230. The first delay circuit 210 may delay the data DQ and generate delayed data DQD. The second delay circuit 220 may delay the data strobe signal DQS based on a delay select signal DSEL, and generate a delayed data strobe signal DQSD. The second delay circuit 220 may variably delay the data strobe signal DQS depending on the delay select signal DSEL. The first delay circuit 210 may have a fixed delay amount, and the second delay circuit 220 may have a delay amount that is variable depending on the delay select signal DSEL. The synchronization circuit 230 may receive the delayed data DQD and the delayed data strobe signal DQSD. The synchronization circuit 230 may sample the delayed data DQD in synchronization with the delayed data strobe signal DQSD. The synchronization circuit 230 may output the delayed data DQD as the internal data DIN in synchronization with the delayed data strobe signal DQSD. For example, the center of the duration or window of the delayed data DQD and the rising edge of the delayed data strobe signal DQSD may be aligned, and the synchronization circuit 230 may sample the delayed data DQD at the rising edge of the delayed data strobe signal DQSD. The synchronization circuit 230 may include a flip-flop to sample the delayed data DQD in synchronization with the delay data strobe signal DQSD.

Referring to FIG. 2, the first delay circuit 210 may include a first basic delay unit 211 and a second basic delay unit 212. The first basic delay unit 211 may delay the data DQ. The second basic delay unit 212 may delay the output of the first basic delay unit 211 and generate the delayed data DQD. Each of the first and second basic delay units 211 and 212 may have a fixed delay amount. The delay amounts of the first and second basic delay units 211 and 212 may be the same as or different from each other. Each of the first and second basic delay units 211 and 212 may include, for example, a plurality of inverters which are coupled in series. The second delay circuit 220 may include a variable delay unit 221 and a third basic delay unit 222. The variable delay unit 221 may delay the data strobe signal DQS depending on the delay select signal DSEL. The third basic delay unit 222 may delay the output of the variable delay unit 221 and generate the delayed data strobe signal DQSD. The variable delay unit 221 may have a delay amount that is variable depending on the delay select signal DSEL, and the third basic delay unit 222 may have a fixed delay amount. The delay amount of the third basic delay unit 222 may be the same as the delay amount of at least one of the first and second basic delay units 211 and 212. For example, the third basic delay unit 222 may include a plurality of inverters which are coupled in series. The variable delay unit 221 may include a plurality of control inverters which are turned on based on the delay select signal DSEL and are coupled in series.

The delay select signal DSEL may be generated depending on a rate of data. The rate of data may be determined based on various operation informations of a semiconductor device. For example, the rate of data may be determined from signals such as a column access strobe (CAS) write latency signal, a write latency signal and a read latency signal. The rate of data may be determined by a sensor which monitors the data received by the receiver circuit 200.

The receiver circuit 200 may further include a data buffer 240 and a data strobe buffer 250. The data buffer 240 may be coupled with the data channel 201, and receive the data DQ transmitted from the external device through the data channel 201. Without a limiting sense, the data DQ may be, for example, a single-ended signal. The data buffer 240 may receive the data DQ by amplifying the data DQ differentially with a reference voltage VREF. The reference voltage VREF may have a voltage level corresponding to, for example, a middle level between the high level and the low level of the data DQ. The data buffer 240 may provide the received data DQ to the first delay circuit 210. The data strobe buffer 250 may be coupled with strobe channels 202 and 203, and receive data strobe signals DQS and DQSB transmitted from the external device through the strobe channels 202 and 203. The data strobe signals DQS and DQSB may be differential signals. The data strobe buffer 250 may receive a data strobe signal DQS through a first data strobe channel 202, and receive a complementary data strobe signal DQSB through a second data strobe channel 203. The data strobe buffer 250 may receive the data strobe signal DQS by amplifying differentially the data strobe signal DQS and the complementary data strobe signal DQSB. The data strobe buffer 250 may provide the received data strobe signal DQS to the second delay circuit 220.

Figure 3A:
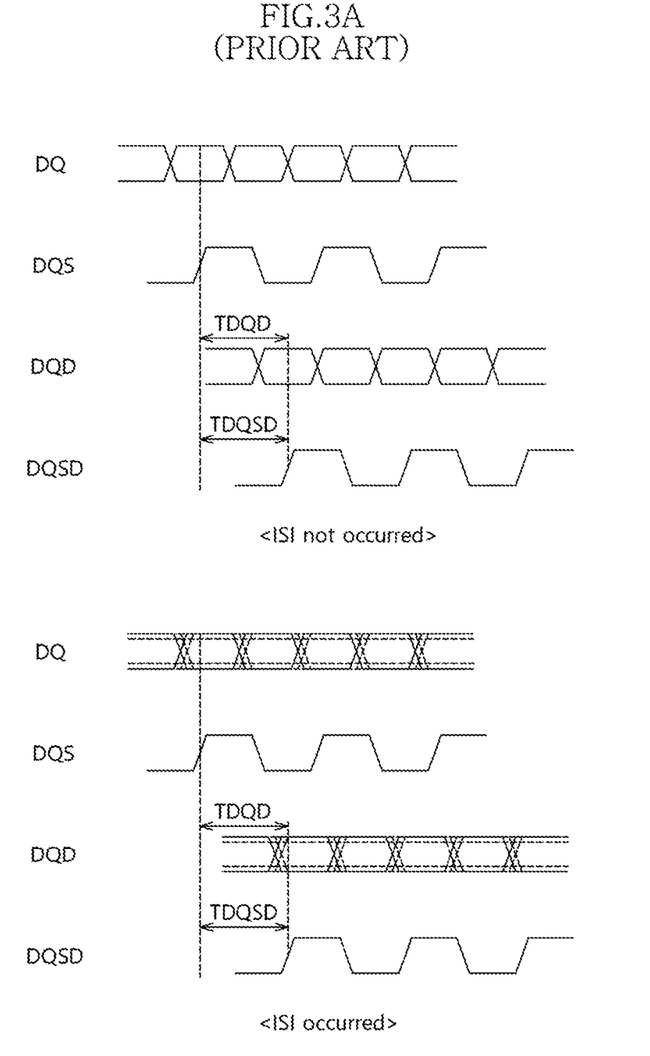
FIG. 3A is of timing diagrams of data and a data strobe signal depending on whether ISI occurs or not in a conventional receiver circuit.
Figure 3B:
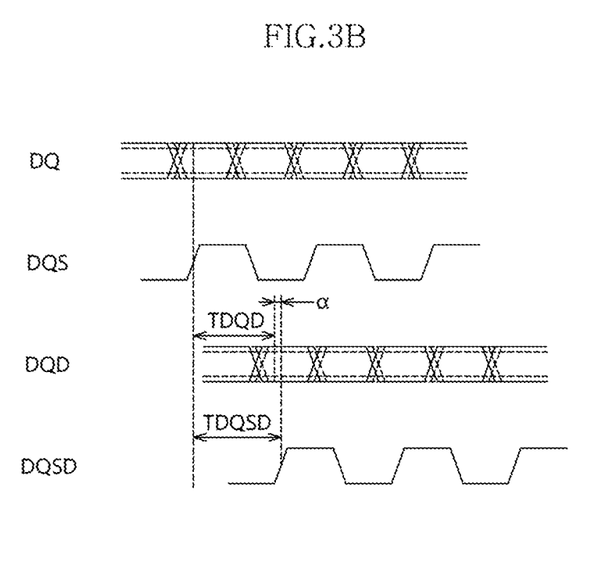
FIG. 3B is a representation of an example of a timing diagram to assist in the explanation of the operation of the receiver circuit in accordance with an embodiment.

FIG. 3a is of timing diagrams of data DQ and a data strobe signal DQS when inter-symbol interference (ISI) occurs or does not occur in a conventional receiver circuit, and FIG. 3b is a representation of an example of a timing diagram to assist in the explanation of the operation of the receiver circuit 200 in accordance with an embodiment. The operation of the receiver circuit 200 in accordance with an embodiment will be described below with reference to FIGS. 2 to 3b. Since the data DQ is a PRBS (pseudo-random binary sequence) signal, the data DQ cannot help but be influenced by inter-symbol interference. For example, if data of a low level is transmitted after data of a high level are transmitted consecutively, a transition time of data may be delayed and the duration or window of data may be decreased. Conversely, since the data strobe signal DQS is a toggle signal like a clock signal, inter-symbol interference may not occur. Therefore, even though the data DQ and the data strobe signal DQS are generated and transmitted at a synchronized time, times at which the receiver circuit 200 receives the data DQ and the data strobe signal DQS may become different from each other. When ISI does not occur, in the case of generating delayed data DQD and a delayed data strobe signal DQSD by delaying the data DQ and the data strobe signal DQS by the same delay amount TDQD and TDQSD as in a conventional receiver circuit, the synchronized state of the data DQ and the data strobe signal DQS may be retained as it is. However, in the case where ISI occurs and a loading is large or a rate of data is fast, a phenomenon may occur in which the duration or window of the data DQ becomes narrow and the center of the duration or window is delayed. Therefore, in the case of generating the delayed data DQD and the delayed data strobe signal DQSD by delaying the data DQ and the data strobe signal DQS by the same delay amount TDQD and TDQSD as in the conventional receiver circuit, a setup margin for sampling the delayed data strobe signal DQSD with the delayed data DQD may become markedly insufficient. In a high speed operation in which the frequency of a clock signal is high, insufficiency of a setup margin may become serious.

In order to prevent such a phenomenon, the receiver circuit 200 in accordance with an embodiment may variably delay the data strobe signal DQS depending on the delay select signal DSEL generated based on a rate of data. Referring to FIGS. 2 and 3b, the data buffer 240 may receive the data DQ transmitted through the data channel 201, and the data strobe buffer 250 may receive the data strobe signals DQS and DQSB transmitted through the strobe channels 202 and 203. In the case where inter-symbol interference occurs in the data DQ, even though the data DQ and the data strobe signal DQS are transmitted at a synchronized time, the synchronized state may be changed. That is to say, the phase of the data DQ may become relatively late in comparison with the data strobe signal DQS. The first delay circuit 210 may delay the data DQ by a fixed delay amount TDQD and generate the delayed data DQD. The second delay circuit 220 may delay the data strobe signal DQS by a variable delay amount TDQSD depending on the delay select signal DSEL generated based on a rate of data, and generate the delayed data strobe signal DQSD. For example, the second delay circuit 220 may delay the data strobe signal DQS additionally by a time a by which the data DQ is delayed by inter-symbol interference, such that the rising edge of the delayed data strobe signal DQSD may be positioned at the center of the duration or window of the delayed data DQD. As a consequence, a setup margin for sampling the delayed data DQD may be secured sufficiently, and the synchronization circuit 230 may generate precisely the internal data DIN from the delayed data DQD in synchronization with the delayed data strobe signal DQSD.

Figure 4:
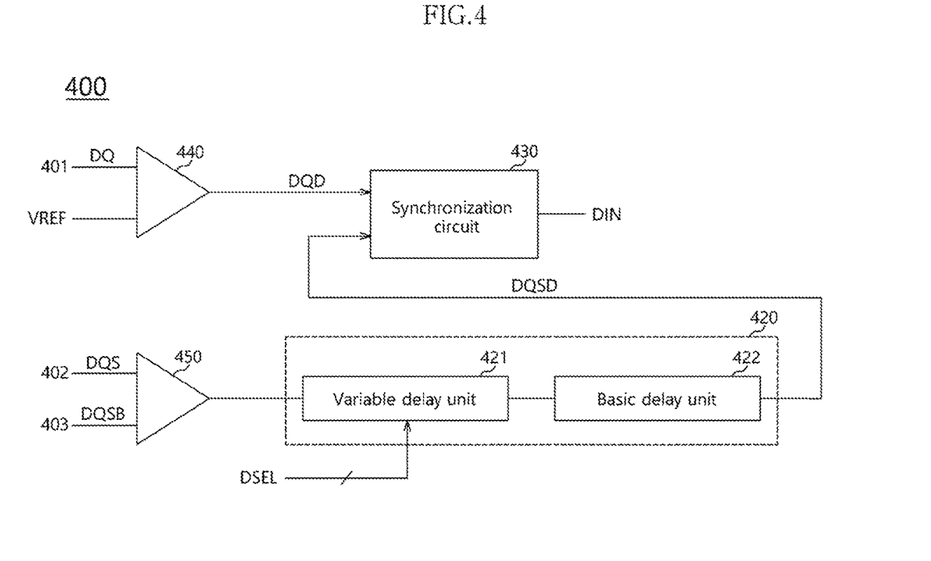
FIG. 4 is a diagram illustrating a representation of an example of the configuration of a receiver circuit in accordance with an embodiment.

FIG. 4 is a diagram illustrating a representation of an example of the configuration of a receiver circuit 400 in accordance with an embodiment. The receiver circuit 400 illustrated in FIG. 4 may be applied as the data receiver circuits 112 and 122 and the strobe receiver circuits 114 and 124 illustrated in FIG. 1. Referring to FIG. 4, the receiver circuit 400 may include a data buffer 440, a data strobe buffer 450, a delay circuit 420, and a synchronization circuit 430. The data buffer 440 may be coupled with a data channel 401, and receive data DQ transmitted through the data channel 401. The data DQ may be a single-ended signal, and the data buffer 400 may generate delayed data DQD by amplifying differentially the data DQ and a reference voltage VREF. The data strobe buffer 450 may be coupled with strobe channels 402 and 403, and receive a data strobe signal DQS and a complementary data strobe signal DQSB transmitted through the strobe channels 402 and 403.

The delay circuit 420 may variably delay the data strobe signal DQS outputted from the data strobe buffer 450, based on a delay select signal DSEL. The delay circuit 420 may generate a delayed data strobe signal DQSD by variably delaying the data strobe signal DQS. The synchronization circuit 430 may sample the delayed data DQD in synchronization with the delayed data strobe signal DQSD, and generate internal data DIN. The synchronization circuit 430 may output the delayed data DQD as the internal data DIN in synchronization with the delayed data strobe signal DQSD. The delay circuit 420 may include a variable delay unit 421 and a basic delay unit 422. The variable delay unit 421 may delay the data strobe signal DQS depending on the delay select signal DSEL. The basic delay unit 422 may delay the output of the variable delay unit 421 and generate the delayed data strobe signal DQSD. The variable delay unit 421 may be varied in delay amount based on the delay select signal DSEL, and the basic delay unit 422 may have a fixed delay amount. For example, the basic delay unit 422 may include a plurality of inverters which are coupled in series. For example, the variable delay unit 421 may include a plurality of control inverters which are coupled in series and are turned on based on the delay select signal DSEL.

Because the delay circuit 420 may variably delay the data strobe signal DQS depending on the delay select signal DSEL, it may be possible to additionally delay the data strobe signal DQS by a time by which the data DQ is delayed due to a rate of data resulting from inter-symbol interference. As a consequence, the receiver circuit 400 may sufficiently secure a setup margin for generating the internal data DIN, and generate, precisely, the internal data DIN.

Figure 5:
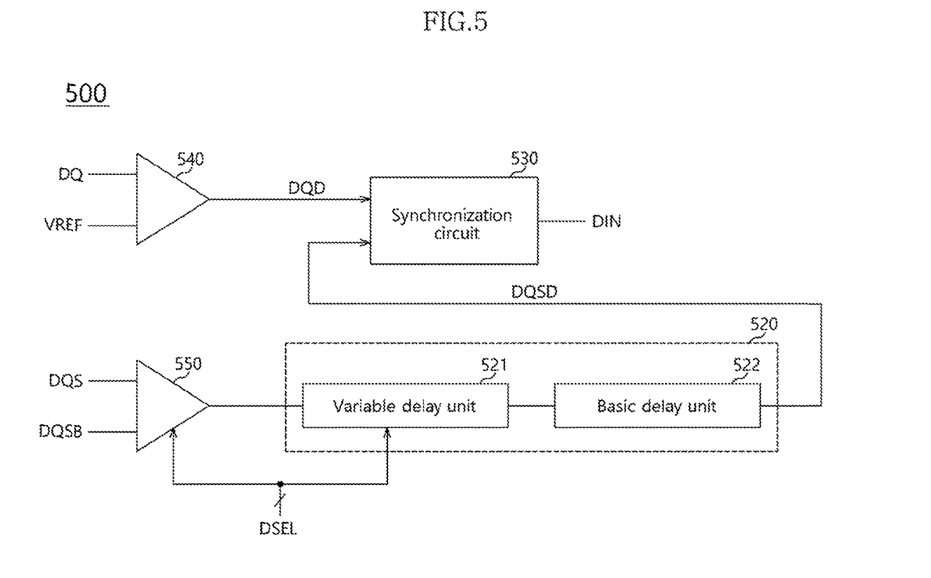
FIG. 5 is a diagram illustrating a representation of an example of the configuration of a receiver circuit in accordance with an embodiment.

FIG. 5 is a diagram illustrating a representation of an example of the configuration of a receiver circuit 500 in accordance with an embodiment. The receiver circuit 500 illustrated in FIG. 5 may be applied as the data receiver circuits 112 and 122 and the strobe receiver circuits 114 and 124 illustrated in FIG. 1. Referring to FIG. 5, the receiver circuit 500 may include a data buffer 540, a data strobe buffer 550, a delay circuit 520, and a synchronization circuit 530. The components of the receiver circuit 500 may be substantially the same as the components of the receiver circuit 400 illustrated in FIG. 4 except that the configuration of the data strobe buffer 550 is different. Repeated descriptions for substantially the same components will be omitted herein. The data strobe buffer 550 may receive a delay select signal DSEL. The data strobe buffer 550 may adjust a receiving time of a data strobe signal DQS based on the delay select signal DSEL. The delay circuit 500 may additionally adjust the delay amount of the data strobe signal DQS through not only the delay circuit 520 but also the data strobe buffer 550 which operates based on the delay select signal DSEL. The data strobe buffer 550 may change a receiving time of the data strobe signal DQS by including a plurality of current paths which are turned on depending on the delay select signal DSEL.

While various embodiments have been described above, it will be understood to those skilled in the art that the embodiments described are examples only. Accordingly, the receiver circuit, and the semiconductor device and system including the same described herein should not be limited based on the described embodiments.

What is claimed is:

1. A receiver circuit comprising:
   a first delay circuit configured to delay data, and output delayed data;
   a second delay circuit configured to variably delay a data strobe signal based on a delay select signal which is generated based on a rate of data determined from at least one of a column access strobe (CAS) write latency, a write latency and a read latency, and output a delayed data strobe signal; and
   a synchronization circuit configured to output the delayed data as internal data in synchronization with the delayed data strobe signal.

2. The receiver circuit according to claim 1, wherein the first delay circuit comprises:
   a first basic delay unit configured to delay the data; and
   a second basic delay unit configured to delay an output of the first basic delay unit, and output the delayed data.

3. The receiver circuit according to claim 2, wherein the second delay circuit comprises:
   a variable delay unit configured to variably delay the data strobe signal based on the delay select signal; and
   a third basic delay unit configured to delay an output of the variable delay unit, and output the delayed data strobe signal.

4. The receiver circuit according to claim 3, wherein each of the first to third basic delay units has a fixed delay amount, and the variable delay unit has a delay amount that is variable based on the delay select signal.

5. The receiver circuit according to claim 3, wherein a delay amount of the second basic delay unit is substantially the same as a delay amount of the third basic delay unit.

6. The receiver circuit according to claim 1, further comprising:
   a data buffer coupled with a data channel and the first delay circuit, and configured to receive the data; and
   a data strobe buffer coupled with a strobe channel and the second delay circuit, and configured to receive the data strobe signal.

7. The receiver circuit according to claim 6,
   wherein the data buffer is coupled with a reference voltage and is configured to receive the data by amplifying the data differentially with the reference voltage; and
   wherein the data strobe buffer is coupled with a second strobe channel to receive a complementary data strobe signal, and is configured to receive the data strobe signal by amplifying differentially the data strobe signal and the complementary data strobe signal.

8. The receiver circuit according to claim 1,
   wherein the synchronization circuit a center of a duration of the delayed data and a rising edge of the delayed data strobe signal are aligned, and
   wherein the synchronization circuit samples the delayed data at the rising edge of the delayed data strobe signal.

9. A receiver circuit comprising:
   a delay circuit configured to variably delay a data strobe signal based on a delay select signal which is generated based on a rate of data determined from at least one of a column access strobe (CAS) write latency, a write latency and a read latency, and generate a delayed data strobe signal; and
   a synchronization circuit configured to output delayed data as internal data in synchronization with the delayed data strobe signal.

10. The receiver circuit according to claim 9, wherein the delay circuit comprises:
    a variable delay unit configured to variably delay the data strobe signal based on the delay select signal; and a basic delay unit configured to delay an output of the variable delay unit, and generate the delayed data strobe signal.

11. The receiver circuit according to claim 10, wherein the variable delay unit has a delay amount that is variable depending on the delay select signal, and the basic delay unit has a fixed delay amount.

12. The receiver circuit according to claim 9, further comprising:
   a data buffer coupled with a data channel and the synchronization circuit, and suitable for receiving data and generating the delayed data; and
   a data strobe buffer coupled with a strobe channel and the delay circuit, and suitable for receiving the data strobe signal.

13. A receiver circuit comprising:
   a data strobe buffer coupled with a strobe channel, and configured to change a receiving time of a data strobe signal based on a delay select signal;
   a delay circuit configured to variably delay the data strobe signal based on the delay select signal which is generated based on a rate of data determined from at least one of a column access strobe (CAS) write latency, a write latency and a read latency, and generating a delayed data strobe signal; and
   a synchronization circuit configured to output delayed data as internal data in synchronization with the delayed data strobe signal.

14. The receiver circuit according to claim 13, wherein the delay circuit comprises:
   a variable delay unit configured to variably delay the data strobe signal based on the delay select signal; and
   a basic delay unit configured to delay an output of the variable delay unit, and generate the delayed data strobe signal.

15. The receiver circuit according to claim 14, wherein the variable delay unit has a delay amount that is variable depending on the delay select signal, and the basic delay unit has a fixed delay amount.

16. The receiver circuit according to claim 13, further comprising:
   a data buffer coupled with a data channel and the synchronization circuit, and configured to receive data and generating the delayed data.

\* \* \* \* \*